United States Patent
Clark (10) Patent No.: US 7,406,639 B2
(45) Date of Patent: Jul. 29, 2008

(54) SCAN CHAIN PARTITION FOR REDUCING POWER IN SHIFT MODE

(75) Inventor: Iain R. Clark, San Jose, CA (US)

(73) Assignee: LSI Corporation, Milpitas, CA (US)

( * ) Notice: Subject to any disclaimer, the term of this patent is extended or adjusted under 35 U.S.C. 154(b) by 247 days.

(21) Appl. No.: 11/012,011

(22) Filed: Dec. 13, 2004

(65) Prior Publication Data

US 2006/0129900 A1   Jun. 15, 2006

(51) Int. Cl.
*G01R 31/28* (2006.01)
(52) U.S. Cl. .................... 714/726; 714/734
(58) Field of Classification Search ........... 714/729, 714/724–727, 734
See application file for complete search history.

(56) References Cited

U.S. PATENT DOCUMENTS

| | | | | |
|---|---|---|---|---|
| 5,592,493 | A | * | 1/1997 | Crouch et al. ............ 714/729 |
| 6,378,093 | B1 | * | 4/2002 | Whetsel ................... 714/726 |
| 6,519,729 | B1 | * | 2/2003 | Whetsel ................... 714/727 |
| 2002/0170010 | A1 | * | 11/2002 | Saxena et al. ............ 714/726 |
| 2005/0268190 | A1 | * | 12/2005 | Kapur et al. ............. 714/726 |
| 2006/0107144 | A1 | * | 5/2006 | Saxena et al. ............ 714/726 |

* cited by examiner

*Primary Examiner*—Cynthia Britt
(74) *Attorney, Agent, or Firm*—Eric James Whitesell (57) ABSTRACT

A scan chain partition includes a serial input coupled to a scan input signal pin of a module under test. A plurality of scan sub-chains is coupled to the serial input. A scan sub-chain output multiplexer is coupled to the plurality of scan sub-chains for sequentially selecting only one of the scan sub-chains in response to a scan sub-chain control signal. A scan sub-chain controller generates the scan sub-chain control signal and gates a scan clock signal to only a scan clock input of the selected scan sub-chain.

16 Claims, 6 Drawing Sheets

SCAN CHAIN PARTITION FOR REDUCING POWER IN SHIFT MODE

BACKGROUND OF THE INVENTION

1. Field of the Invention

The present invention is directed to testing integrated circuit designs. More specifically, but without limitation thereto, the present invention is directed to high speed scan testing of an integrated circuit design.

2. Description of the Prior Art

Scan testing of flip-flops, or flops, and associated random logic in integrated circuit designs is typically performed at a clock speed that is limited by the maximum supply current that may be dissipated by the integrated circuit. Built-in self-test (BIST) uses scan chains with a low-frequency shift register and a scan input for tester precompression.

SUMMARY OF THE INVENTION

In one embodiment, a scan chain partition for reducing power in shift mode includes:
 a serial input coupled to a scan input signal pin of a module under test;
 a plurality of scan sub-chains coupled to the serial input;
 a scan sub-chain output multiplexer coupled to the plurality of scan sub-chains for sequentially selecting a scan shift output of a single one of the plurality of scan sub-chains in response to a scan sub-chain control signal; and
 a scan sub-chain controller for generating the scan sub-chain control signal and for generating a scan clock signal at a scan clock input of the single one of the plurality of scan sub-chains.

In another embodiment, a method of partitioning a scan chain to reduce power in shift mode includes steps of:
 (a) receiving a serial input signal from a scan input signal pin of a module under test;
 (b) generating a shift input signal from the serial input signal at a scan shift input of each of a plurality of scan sub-chains;
 (c) multiplexing a scan shift output of each of the plurality of scan sub-chains for sequentially selecting the scan shift output of a single one of the plurality of scan sub-chains in response to a scan sub-chain control signal; and
 (d) generating the scan sub-chain control signal and a scan clock signal at a scan clock input of the single one of the plurality of scan sub-chains.

BRIEF DESCRIPTION OF THE DRAWINGS

The present invention is illustrated by way of example and not limitation in the accompanying figures, in which like references indicate similar elements throughout the several views of the drawings, and in which.

Elements in the figures are illustrated for simplicity and clarity and have not necessarily been drawn to scale. For example, the dimensions of some of the elements in the figures may be exaggerated relative to other elements to help to improve understanding of the following description of the illustrated embodiments.

To simplify referencing in the description of the illustrated embodiments of the present invention, indicia in the figures may be used interchangeably to identify both the signals that are communicated between the elements and the connections that carry the signals. For example, an address communicated on an address bus may be referenced by the same number used to identify the address bus.

DESCRIPTION OF THE ILLUSTRATED EMBODIMENTS

During the development of a circuit, for example, an application specific integrated circuit (ASIC), test logic is typically inserted late in the design cycle, especially scan test logic. The implementation of clock signals in the circuit is generally designed to perform the function of the circuit and often does not account for circuit testing. As a result, the capability of test logic insertion tools to achieve high scan fault coverage is often limited by the clock implementation. The dependence of power consumption on the clock implementation is described in "Minimized Power Consumption For Scan-Based BIST", Stefan Gerstendoerfer et al., ITC International Test Conference 1999.

In addition to the limitations imposed by the clock implementation, the power consumption of the circuit may further limit the capability of test logic insertion tools to achieve high scan fault coverage. Specifically, a chip designed for low power consumption in the functional mode may exhibit extremely high power consumption in the scan test mode because a greater number of flip-flops are switching during each clock cycle. The term "flip-flop", or "flop", is used herein to include all types of devices in an integrated circuit that have a clocked input, including but not limited to memory circuits. The higher power consumption during testing may alter the behavior of the circuit or even result in damage to the circuit. Also, the requirement of higher supply current at the scan clock rate may exceed the tester drive current capability and may be limited by the area overhead available on the chip for dissipating the higher power. The higher power dissipation is incurred in the clock tree and the combinational logic, if the combinational logic is not held in the quiescent state during scan shift.

Previous methods of scan testing combine multiple scan chains into a single scan chain for each chip scan input/output pin pair. These methods require that every flop in the integrated circuit design be clocked once for every scan test frame. A typical scan test frame includes shifting a bit of a test pattern into the input of each flop, clocking all the flops, and reading the output of each flop.

Figure 1:
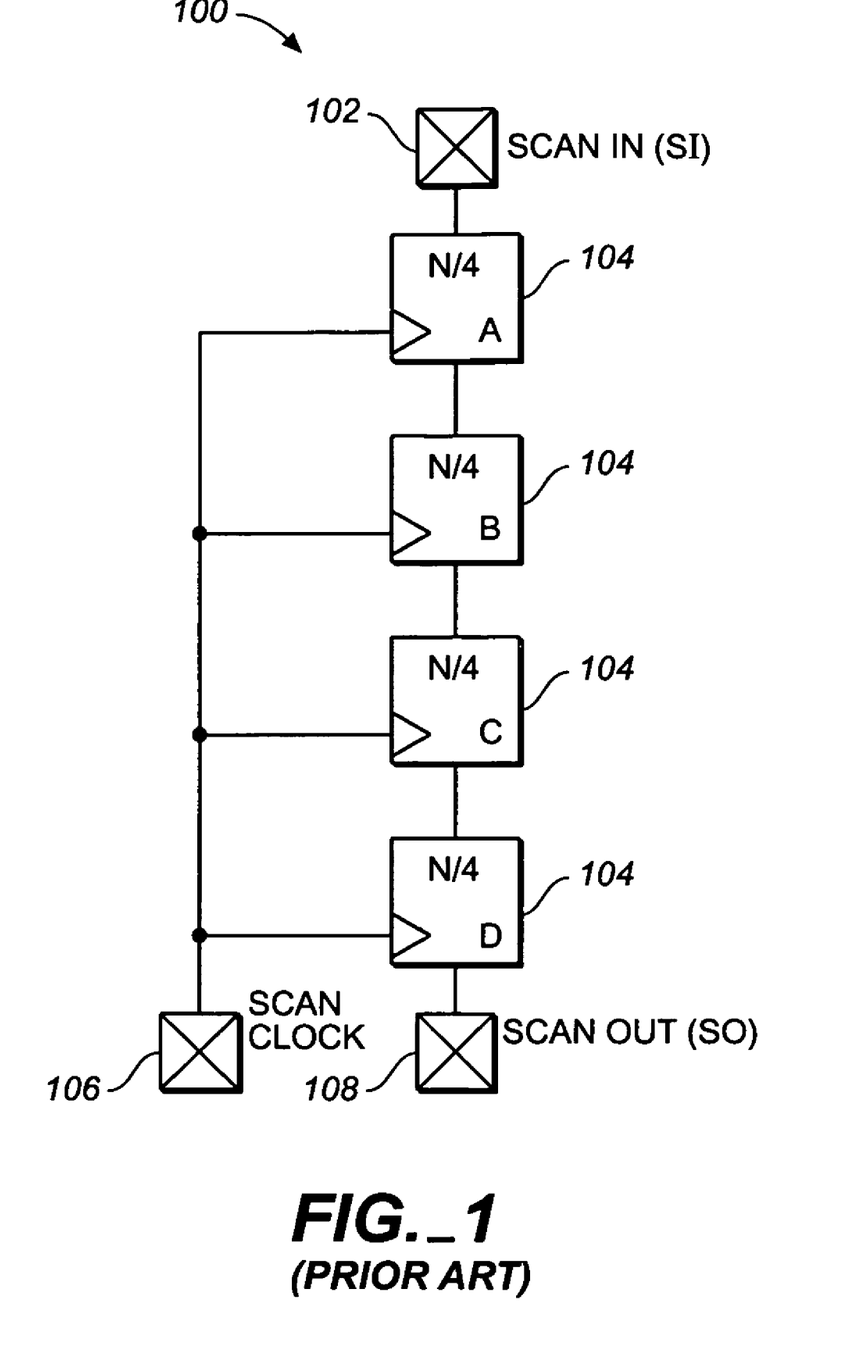
FIG. 1 illustrates a scan chain for an integrated circuit design of the prior art.

FIG. 1 illustrates a scan chain partition 100 for an integrated circuit design of the prior art. Shown in FIG. 1 are a scan test input 102, scan chains 104, a scan test clock 106, and a scan test output 108.

In FIG. 1, each of the scan chains 104 includes a number of flops equal to the total number of flops N in the scan chain 100 divided by the partition index M, which is equal to four in this example. The scan test clock 106 drives every scan chain 104 in the scan chain partition 100 in parallel. As a result, the functional logic (not shown) that depends on the outputs of the flops in each scan sub-chain 104 requires additional supply current for signals that change state, or transition between logic levels. Also, the supply current required by the scan test clock 106 to drive the clock inputs of the sub-chains 104 depends on the number of flops in the scan chain partition 100. The number of flops in the scan chain partition 100 is typically in the range of several thousand or more. Each scan chain partition 100 is connected to a pair of scan input/output pins on the integrated circuit chip to communicate with the test environment.

One solution to the power consumption problem is to create a dedicated scan shift output for every flop, so that the functional output may be held quiescent during scan shift, that is, in a static logic state. This reduces the supply current required for the combinational logic, however, this solution does not address the supply current required for the clock tree, which typically approaches 30 percent of the total supply current. The average supply current consumption including that of the clock tree and the combinational logic may be reduced by increasing the period of the scan shift clock, however, this disadvantageously increases the tester cycle time. Also, increasing the period of the scan shift clock does not reduce the peak clock current. As a result, both average supply current and peak supply current may limit the degree of test coverage realizable by previous scan testing methods. Further, these methods may require an increase of about 2.5 percent in chip area and may also result in increased delay from the clock rising edge (active) to data ready at the "Q" output of the flip flop.

A feature of the method of the present invention is that the number of scan chains internal to an integrated circuit does not have to be equal to the number of scan input/output pin pairs. If the number of internal scan chains for each scan input/output pin pair may be increased by a partition index M while maintaining the same total number of flops N per scan chain, then each of the M scan sub-chains may be clocked at a reduced rate of 1/M while achieving the same scan data throughput. As a result, the supply current may be correspondingly reduced. Alternatively, the M scan sub-chains may be clocked at a higher rate within the limits of the maximum operating current and the tester maximum supply current to reduce tester time. However, the number of available scan input/output pin pairs is typically limited by the tester hardware design.

The method of the present invention overcomes the tester limitation on the number of available scan input/output pin pairs. In one embodiment, a scan chain partition includes:

a serial input coupled to a scan input signal pin of a module under test;
a plurality of scan sub-chains coupled to the serial input;
a scan sub-chain output multiplexer coupled to the plurality of scan sub-chains for sequentially selecting a scan shift output of a single one of the plurality of scan sub-chains in response to a scan sub-chain control signal; and
a scan sub-chain controller for generating the scan sub-chain control signal and for generating a scan clock signal at a scan clock input of the single one of the plurality of scan sub-chains.

Figure 2A:
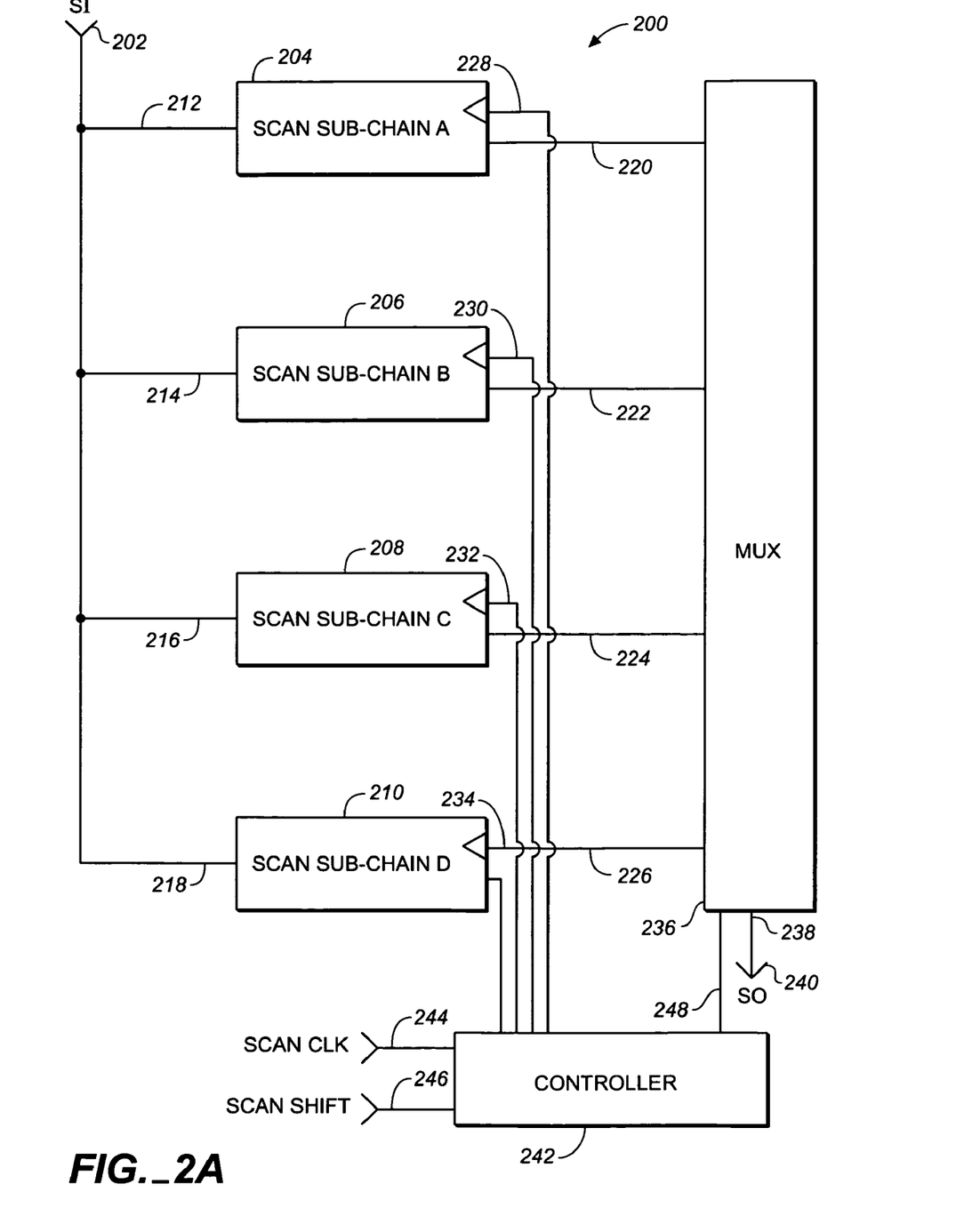
FIG. 2A illustrates a proposed scan chain partition for an integrated circuit design.

FIG. 2A illustrates a proposed scan chain partition 200 for an integrated circuit design. Shown in FIG. 200 are a scan input pin of a module under test 202, scan sub-chains 204, 206, 208 and 210, scan sub-chain shift inputs 212, 214, 216 and 218, scan sub-chain shift outputs 220, 222, 224 and 226, scan sub-chain clock inputs 228, 230, 232 and 234, a scan sub-chain output multiplexer 236, a multiplexed scan sub-chain output 238, a scan shift output signal pin of a module under test 240, a scan sub-chain controller 242, a scan clock input 244, a scan shift mode input 246, and a scan sub-chain control signal 248.

In the embodiment of FIG. 2A, the scan input pin of a module under test 202 is connected to each of the scan sub-chain shift inputs 212, 214, 216 and 218. In this example, a partition index of M equal to four is used, however, the same configuration may also be used for any other value of M greater than one to practice various other embodiments within the scope of the appended claims. Each of the four scan sub-chains 204, 206, 208 and 210 includes N/M (N/4 in this example) elements or flops.

Each of the scan sub-chain shift inputs 212, 214, 216 and 218 is connected directly to the scan input pin of a module under test (SI) 202, in contrast to the arrangement of FIG. 1, in which the shift input of each scan sub-chain is connected to the shift output of the preceding scan sub-chain. Each of the scan sub-chains 204, 206, 208 and 210 is clocked in a predetermined sequence by the scan sub-chain controller 242. One of the scan sub-chain shift outputs 220, 222, 224 and 226 of the scan sub-chain is selected by the scan sub-chain output multiplexer 236 and is generated as output at the multiplexed scan sub-chain output 238. The multiplexed scan sub-chain output 238 is connected to the scan shift output signal pin of the module under test 240.

The scan sub-chain controller 242 receives the scan clock signal at the scan clock input 244, and the scan clock signal is gated sequentially to one of the scan sub-chain clock inputs 228, 230, 232 and 234 for each scan clock rising edge when the scan shift mode signal 246 is asserted in the scan test mode. The scan sub-chain controller 242 also generates the scan sub-chain control signal 248 for the scan sub-chain output multiplexer 236 that selects the one of the scan sub-chains 204, 206, 208 and 210 that is being clocked by the scan sub-chain controller 242. The clocking of only one of the scan sub-chains 204, 206, 208 and 210 with each scan clock rising edge is another distinction between the scan partition 200 and the arrangement of FIG. 1, in which all the scan sub-chains are clocked in parallel with every scan clock rising edge.

Figure 2B:
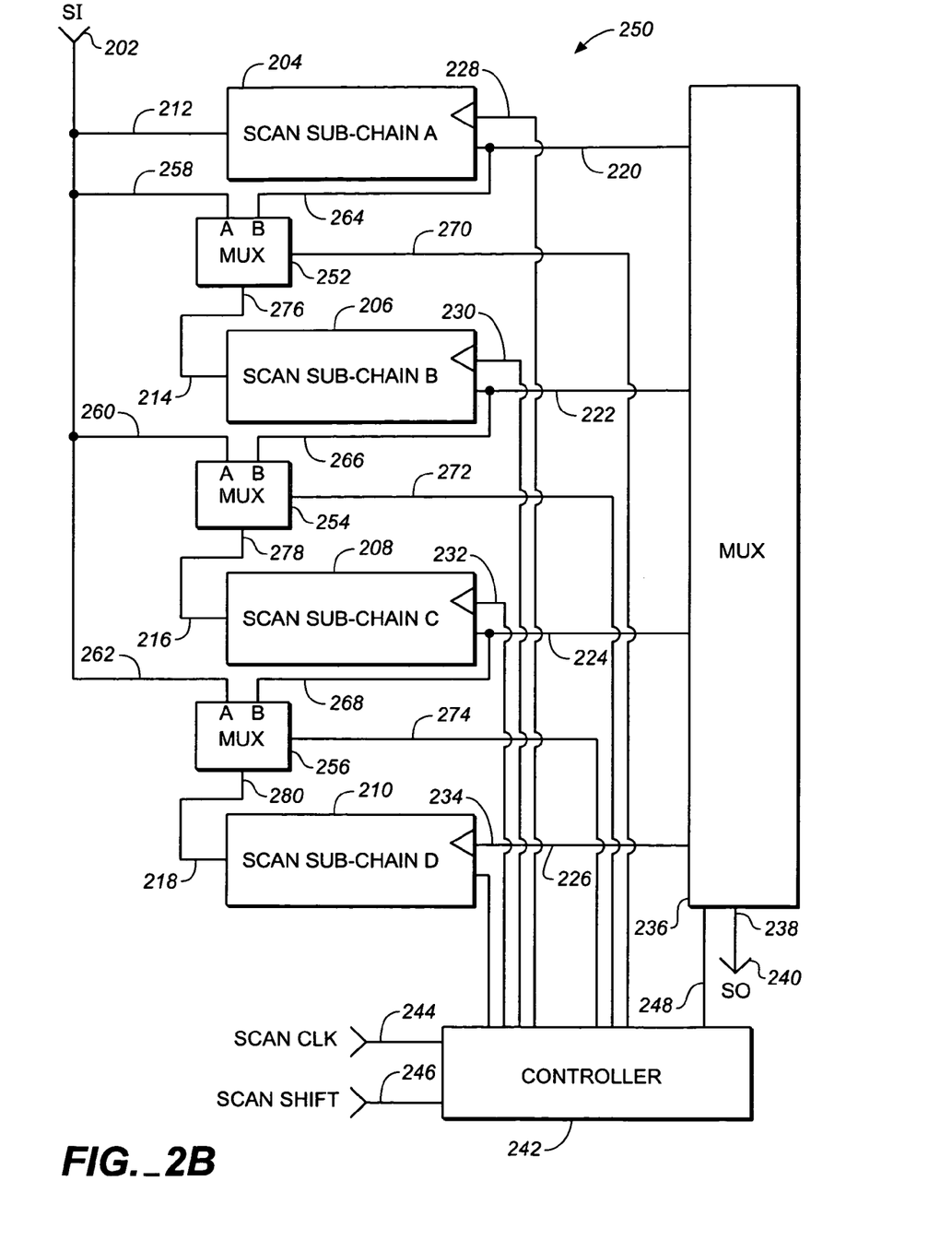
FIG. 2B illustrates a scan chain partition that may be optionally configured as in FIG. 2A or as a single scan chain.

FIG. 2B illustrates a scan chain partition 250 that may be optionally configured as in FIG. 2A or as a single scan chain. Shown in FIG. 2B are a scan input signal pin of the module under test 202, scan sub-chains 204, 206, 208 and 210, scan sub-chain shift inputs 212, 214, 216 and 218, scan sub-chain shift outputs 220, 222, 224 and 226, scan sub-chain clock inputs 228, 230, 232 and 234, a scan sub-chain output multiplexer 236, a multiplexed scan sub-chain output 238, a scan shift output signal pin of a module under test 240, a scan sub-chain controller 242, a scan clock input 244, a scan shift mode input 246, a scan sub-chain control signal 248, scan sub-chain input multiplexers 252, 254 and 256, scan sub-chain input multiplexer "A" inputs 258, 260 and 262, scan sub-chain input multiplexer "B" inputs 264, 266 and 268, scan sub-chain input multiplexer control inputs 270, 272 and 274, and scan sub-chain input multiplexer outputs 276, 278 and 280.

In the embodiment of FIG. 2B, the scan input pin of the module under test 202 is connected to each of the scan sub-chain shift inputs 212, 214, 216 and 218 of the scan sub-chains 204, 206, 208 and 210 as in FIG. 2A and to the scan sub-chain input multiplexer "A" inputs 258, 260 and 262. The scan sub-chain input multiplexer "B" inputs 264, 266 and 268 are connected to the scan sub-chain shift outputs 220, 222 and 224 of the previous corresponding scan sub-chains 204, 206 or 208. The scan sub-chain input multiplexers 252, 254 and 256 are 2:1 multiplexers that may select either the scan input signal pin of the module under test 202 or the scan sub-chain shift output 220, 222, 224 or 226 of the previous one of the scan sub-chains 204, 206 or 208 in response to the corresponding scan sub-chain input multiplexer control signal 270, 272 or 274.

Selecting the scan sub-chain input multiplexer "A" inputs 258, 260 and 262 configures the scan chain partition 250 in the arrangement of FIG. 2A, while selecting the scan sub-chain input multiplexer "B" inputs 264, 266 and 268 configures the scan chain partition 250 in the arrangement of FIG. 1.

Figure 2C:
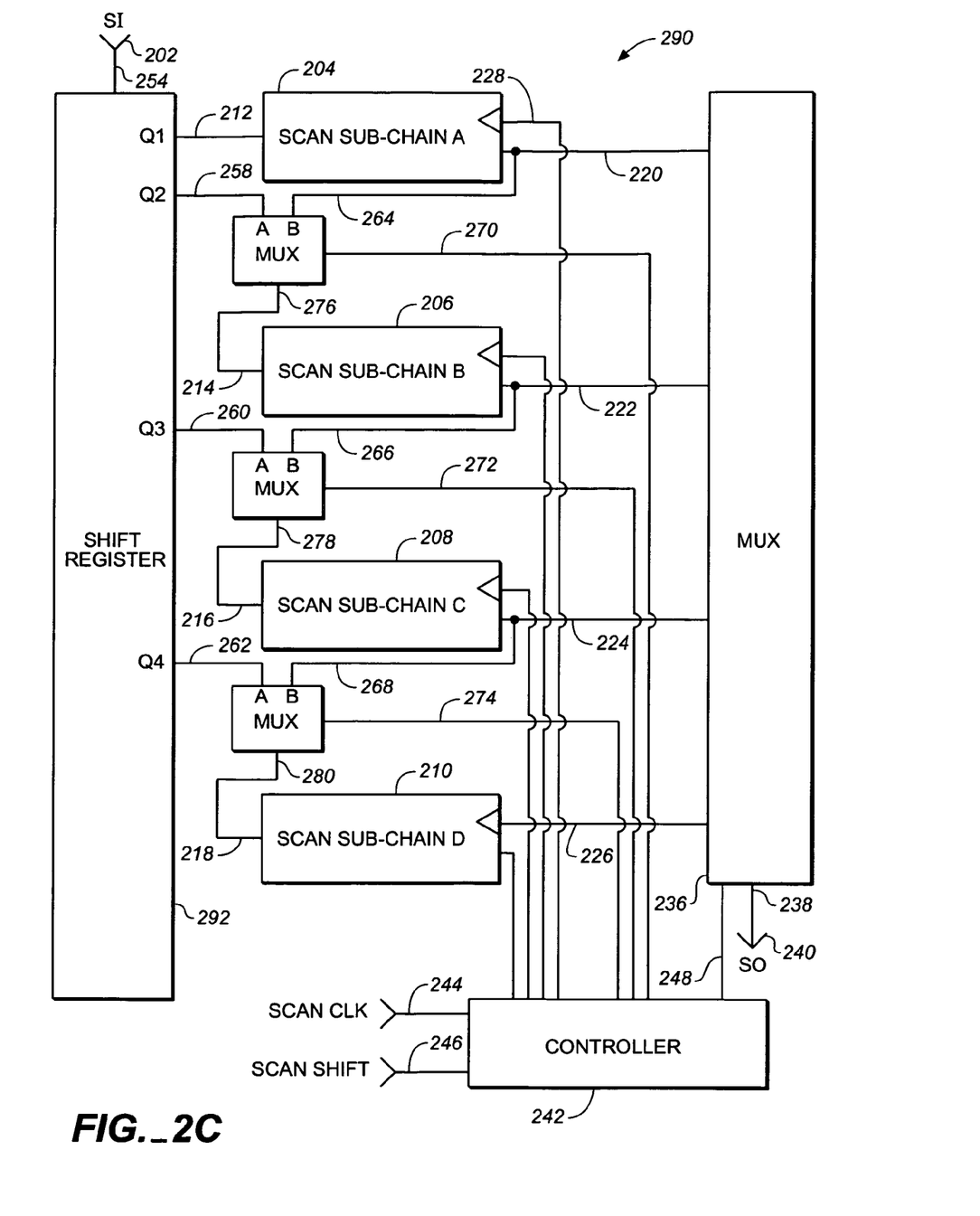
FIG. 2C illustrates a scan chain partition that may be optionally configured as in FIG. 2A or as multiple scan sub-chains connected to a shift register.

FIG. 2C illustrates a scan chain partition 290 that may be optionally configured as in FIG. 2A or as multiple scan sub-chains connected to a shift register. Shown in FIG. 290 are a scan input signal pin of the module under test 202, scan sub-chains 204, 206, 208 and 210, scan sub-chain shift inputs 212, 214, 216 and 218, scan sub-chain shift outputs 220, 222, 224 and 226, scan sub-chain clock inputs 228, 230, 232 and 234, a scan sub-chain output multiplexer 236, a multiplexed scan sub-chain output 238, a scan shift output signal pin of a module under test 240, a scan sub-chain controller 242, a scan clock input 244, a scan shift mode input 246, a scan sub-chain control signal 248, scan sub-chain input multiplexers 252, 254 and 256, scan sub-chain input multiplexer "A" inputs 258, 260 and 262, scan sub-chain input multiplexer "B" inputs 264, 266 and 268, scan sub-chain input multiplexer control inputs 270, 272 and 274, scan sub-chain input multiplexer outputs 276, 278 and 280, and a shift register 292, a serial input 294 and parallel outputs Q1, Q2, Q3 and Q4.

In the embodiment of FIG. 2C, the scan shift signal input pin 202 of the module under test (MUT) drives the serial input 254 of the scan input shift register 252. The scan input shift register 252 may be implemented, for example, as M flops. The M parallel outputs Q1, Q2, Q3 and Q4 of the M flops are connected to the scan sub-chain shift input 212 of the scan sub-chain 204 and to the scan sub-chain input multiplexer "A" inputs 258, 260 and 262.

The scan sub-chain input multiplexer "B" inputs 264, 266 and 268 are connected to the scan sub-chain shift outputs 220, 222 and 224 of the previous corresponding scan sub-chains 204, 206 or 208.

Selecting the scan sub-chain input multiplexer "A" inputs 258, 260 and 262 configures the scan chain partition 290 as multiple scan sub-chains for greater throughput, while selecting the scan sub-chain input multiplexer "B" inputs 264, 266 and 268 configures the scan chain partition 290 equivalent to the arrangement of FIG. 1. If only the partitioned scan chain configuration is desired, the scan sub-chain input multiplexers 252, 254 and 256 may be omitted.

In the embodiments of FIGS. 2A, 2B and 2C, the scan sub-chain output multiplexer 236 selects a different one of the scan sub-chain shift outputs 220, 222, 224 and 226 according to a sequence in response to the scan sub-chain control signal 248 from the scan sub-chain controller 242. The scan sub-chain controller 242 also generates only one scan clock rising edge at one of the scan sub-chain clock inputs 228, 230, 232 and 234 for each M scan pulses received at the scan clock input 244 of the scan sub-chain controller 242. The selected one of the scan sub-chain shift outputs 220, 222, 224 and 226 is generated as output at the multiplexed scan sub-chain output 238 from the scan sub-chain output multiplexer 236. The multiplexed scan chain output 238 is connected to the corresponding scan shift output signal pin (SO) 240 of the module under test.

By using independent scan shift clocks or clock gating of the scan shift clock, the M internal scan sub-chains may be clocked individually by separate clock pulses. As a result, both the peak current and the average current are reduced by a factor of M compared to the previous methods described above.

A feature of the method of the present invention is that the number of internal scan sub-chains in a integrated circuit design may be increased by an arbitrary factor M to achieve reduced power consumption without significantly increasing die area. As a result, peak and average supply current may be held within the maximum operating current range of the integrated circuit and the maximum tester supply current without reducing test cycle time. Further, no changes to the cell library are required, and existing design tools may be used to implement the gated clocks. Also, the necessary modifications to the scan test patterns for the scan chain partition described above may be made with currently available automatic test pattern generation programs.

Figure 3:
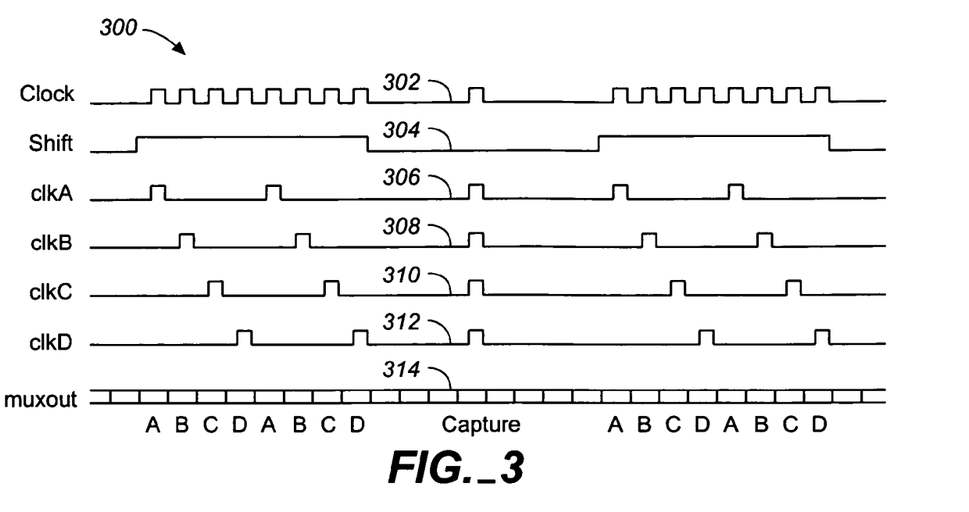
FIG. 3 illustrates a timing diagram for the scan chain partition of FIG. 2A.

FIG. 3 illustrates a timing diagram 300 for the scan chain partition 200 of FIG. 2. Shown in FIG. 3 are a scan clock signal 302, a shift control signal 304, scan sub-chain clock signals 306, 308, 310 and 312, and a scan sub-chain output multiplexer control signal 314.

In FIG. 3, the scan clock signal 302 may be generated according to well known techniques at a frequency of a typical scan clock frequency limited by peak current times a number M of scan sub-chains for each scan shift input pin in module under test. For example, an integrated circuit design may have 128,000 flops with 32 scan sub-chains of 4,000 flops per sub-chain. There are 5,000 scan frames, and the normal mode operating frequency limit is 100 MHZ. The scan shift clock frequency for the 32 scan sub-chains must be limited to 20 MHZ to avoid exceeding the peak supply current limit, however, a scan shift clock frequency of 200 MHZ is desired to reduce tester time by a factor of ten and to provide a more thorough defect screening. Accordingly, a value of 10 is selected for N, and the 32 scan sub-chains are each partitioned into 10 parallel stepped scan sub-chains as described above. The average current in the shift mode using the partitioned scan chain is the same as the supply current in the normal mode, and the scan test time is reduced by a factor of 10 compared to a conventional scan chain topology. The extra cost of (32×10=320) 2:1 multiplexers, (32) 4:1 multiplexers, four flops, and about 100 NAND equivalents is negligible.

The shift control signal 304 is used by the scan sub-chain controller 208 to gate the scan clock signal 302. When the shift control signal 304 is asserted, the scan sub-chains are each clocked separately in sequence by the scan sub-chain clock signals 306, 308, 310 and 312 as shown in FIG. 3. When the shift control signal 304 is negated, a capture cycle is performed concurrently on the stepped scan sub-chains according to well known scan testing techniques.

The scan sub-chain control signal 314 selects the scan sub-chain shift output 220 of the scan sub-chain 210 concurrently clocked by the corresponding one of the scan sub-chain clock signals 306, 308, 310 and 312 to generate the multiplexed scan sub-chain output 228 from the scan sub-chain output multiplexer 212.

Figure 4:
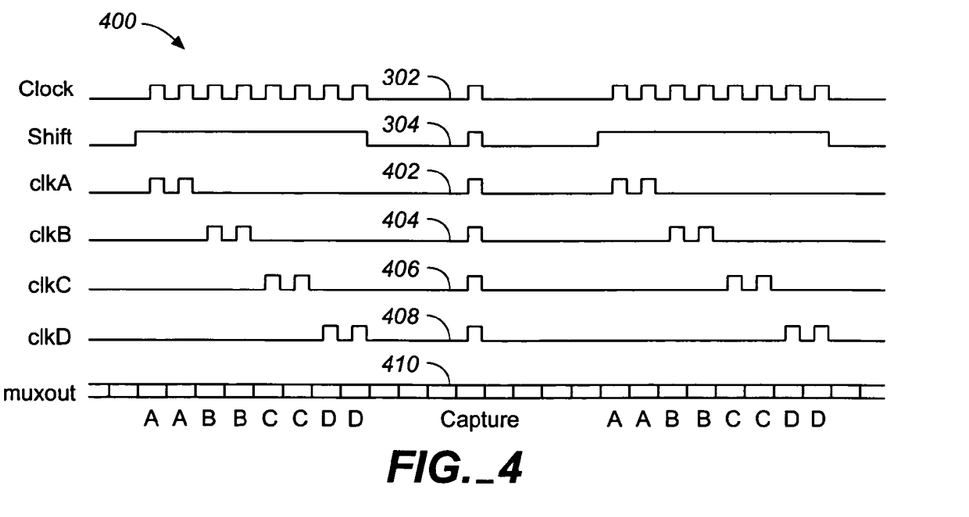
FIG. 4 illustrates a timing diagram of the scan chain partition of FIG. 2A for detecting transition delay faults.

FIG. 4 illustrates a timing diagram 400 of the scan chain partition 200 of FIG. 2 for detecting transition delay faults. Shown in FIG. 4 are a scan clock signal 302, a shift control signal 304, scan sub-chain clock signals 402, 404, 406 and 408, and a scan sub-chain output multiplexer control signal 410.

In FIG. 4, the scan clock signal 302 and the shift control signal 304 are the same as described above for FIG. 3, except that when the shift control signal 304 is asserted, each of the scan sub-chains is clocked twice by the scan sub-chain clock signals 402, 404, 406 and 408 as shown in FIG. 4. The first scan clock pulse is used to load data from the shift input of each flop in the scan sub-chain to check for stuck-at faults, and the second clock pulse is used to load data from the D-input of each flop in the scan sub-chain to check for transition delay faults. When the shift control signal 304 is negated, a capture cycle is performed concurrently on the scan sub-chains as described above for FIG. 3.

The scan sub-chain output multiplexer control signal 412 selects the scan sub-chain shift output 220 concurrently clocked by the corresponding one of the stepped scan sub-chain clock signals 402, 404, 406 and 408 to generate the multiplexed scan sub-chain output 228 from the scan sub-chain output multiplexer 212.

In another aspect of the present invention, a method of generating multiple scan clock signals includes steps for:
(a) receiving a serial input signal from a scan input signal pin of a module under test;
(b) generating a shift input signal from the serial input signal at a scan shift input of each of a plurality of scan sub-chains;
(c) multiplexing a scan shift output of each of the plurality of scan sub-chains for sequentially selecting the scan shift output of a single one of the plurality of scan sub-chains in response to a scan sub-chain control signal; and
(d) generating the scan sub-chain control signal and a scan clock signal at a scan clock input of the single one of the plurality of scan sub-chains.

Figure 5:
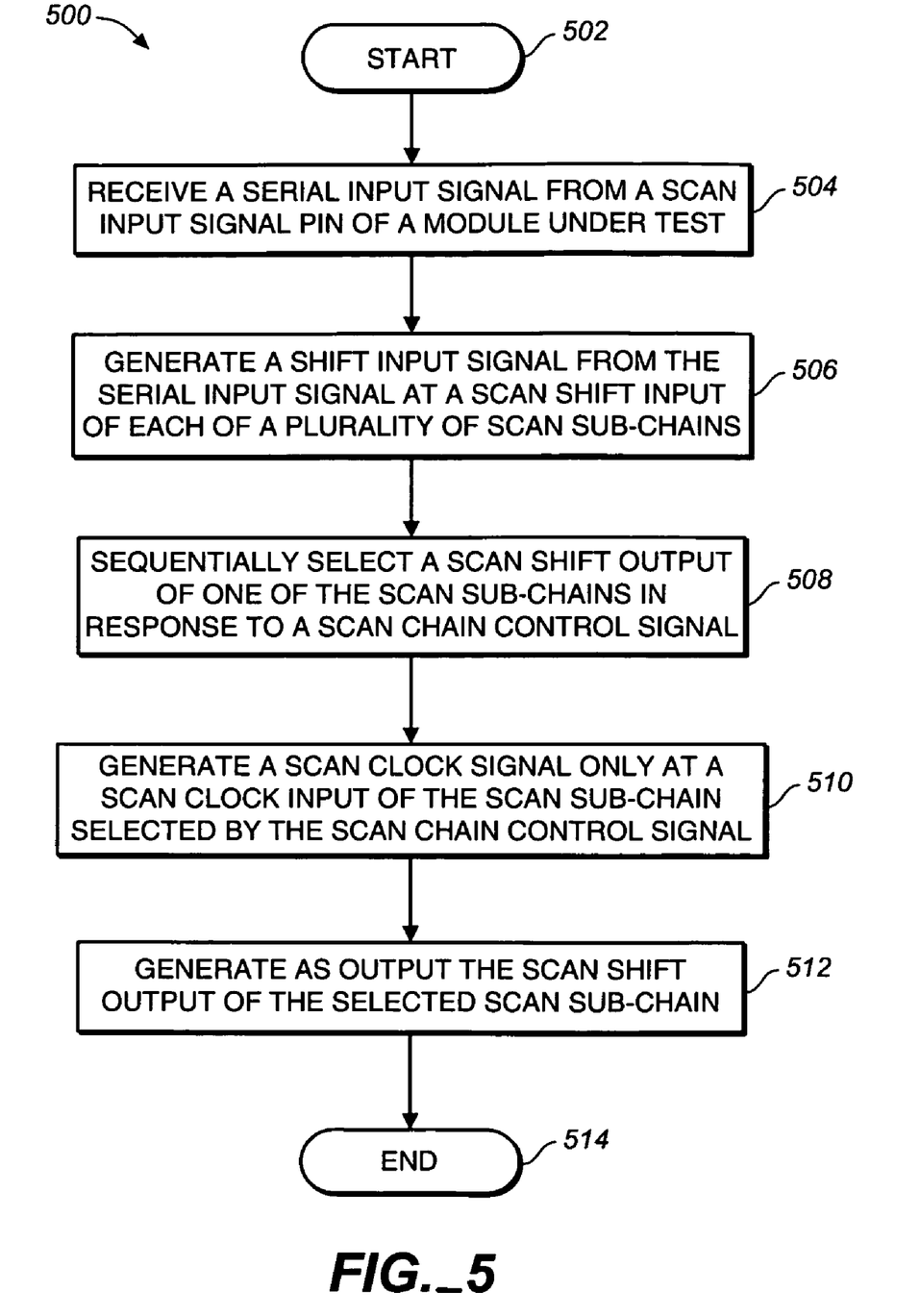
FIG. 5 illustrates a flow chart for a method of partitioning a scan chain into sub-chains.

FIG. 5 illustrates a flow chart 500 for a method of partitioning a scan chain into sub-chains.

Step 502 is the entry point of the flow chart 500.

In step 504, a serial input signal is received from a scan input signal pin of a module under test.

In step 506, a shift input signal is generated from the serial input signal at a scan shift input of each of a plurality of scan sub-chains. For example, the serial input signal may be connected directly to the scan input signal pin of the module under test, or the serial input signal may be connected to the input of a shift register. In this arrangement, the parallel outputs of the shift register are connected respectively to the scan shift inputs of the scan sub-chains.

In step 508, a scan shift output of one of the scan sub-chains is sequentially selected in response to a scan sub-chain control signal.

In step 510, a scan clock signal is generated only at a scan clock input of the scan sub-chain selected by the scan sub-chain control signal. For example, a different scan sub-chain may be selected for each scan clock signal for detecting stuck-at faults, or the same scan sub-chain may be selected for two clock pulses for detecting transition delay faults. Clocking only one scan sub-chain in the scan chain partition with each scan clock pulse advantageously reduces the required supply current by the number of scan sub-chains M. This allows a faster scan clock speed to be used in the shift mode at the same supply current required for the normal mode at a slower clock speed.

In step 512, the scan shift output of the selected scan sub-chain is generated as output.

Step 514 is the exit point of the flow chart 500.

Although the method of the present invention illustrated by the flowchart description above is described and shown with reference to specific steps performed in a specific order, these steps may be combined, sub-divided, or reordered without departing from the scope of the claims. Unless specifically indicated herein, the order and grouping of steps is not a limitation of the present invention.

While the invention herein disclosed has been described by means of specific embodiments and applications thereof, numerous modifications and variations may be made thereto by those skilled in the art without departing from the scope of the invention set forth in the following claims.

What is claimed is:

1. A scan chain partition comprising:
a serial input coupled to a scan input signal pin of a module under test;
a plurality of scan sub-chains coupled to the serial input;
a scan sub-chain controller coupled to the plurality of scan sub-chains for selecting only one of the scan sub-chains and for gating only one of a plurality of scan clock pulses to a scan clock input of only the selected scan sub-chain; and
a scan sub-chain input multiplexer for connecting a scan shift input of each of the scan sub-chains either to a scan shift output of another one of the scan sub-chains or to the serial input.

2. The scan chain partition of claim 1 further comprising a shift register, the shift register comprising:
a serial shift input coupled to the serial input; and
parallel outputs coupled respectively to a shift input of each of the scan sub-chains.

3. A scan chain partition comprising:
a serial input coupled to a scan input signal pin of a module under test;
a plurality of scan sub-chains coupled to the serial input;
a scan sub-chain controller coupled to the plurality of scan sub-chains for selecting only one of the scan sub-chains and for gating only one of a plurality of scan clock pulses to a scan clock input of only the selected scan sub-chain;
a shift register having a serial shift input coupled to the serial input and parallel outputs for coupling respectively to a shift input of each of the scan sub-chains; and
a scan sub-chain input multiplexer for connecting a scan shift input of each of the scan sub-chains either to a scan shift output of another one of the scan sub-chains or to one of the parallel outputs of the shift register.

4. A method comprising steps of:
(a) receiving a serial input signal from a scan input signal pin of a module under test;
(b) coupling the serial input signal to a scan shift input of each of a plurality of scan sub-chains;
(c) generating a scan sub-chain control signal for selecting only one of the scan sub-chains;
(d) gating only one of a plurality of scan clock pulses to a scan clock input of the selected scan sub-chain; and
(e) connecting a scan shift input of each of the scan sub-chains either to a scan shift output of another one of the scan sub-chains or to the serial input.

5. The method of claim 4, further comprising steps of:
shifting the serial input through a shift register in step (b); and for
coupling parallel outputs of the shift register respectively to a shift input of each of the scan sub-chains.

6. A method comprising steps of:
(a) receiving a serial input signal from a scan input signal pin of a module under test;
(b) coupling the serial input signal to a scan shift input of each of a plurality of scan sub-chains;
(c) generating a scan sub-chain control signal for selecting only one of the scan sub-chains;
(d) gating only one of a plurality of scan clock pulses to a scan clock input of the selected scan sub-chain;

(e) shifting the serial input through a shift register for coupling parallel outputs of the shift register respectively to a shift input of each of the scan sub-chains; and (f) connecting a scan shift input of each of the scan sub-chains either to a scan shift output of a previous scan sub-chain or to one of the parallel outputs of the shift register.

7. A scan chain partition comprising:
a serial input coupled to a scan input signal pin of a module under test;
a plurality of scan sub-chains coupled to the serial input;
a scan sub-chain controller coupled to the plurality of scan sub-chains, the scan sub-chain controller for selecting only one of the scan sub-chains while only two scan clock pulses are gated to a scan clock input of only the selected scan sub-chain.

8. The scan chain partition of claim 7 further comprising the scan sub-chain controller for selecting a different one of the scan sub-chains after gating each two scan clock pulses.

9. A scan chain partition comprising:
a serial input coupled to a scan input signal pin of a module under test;
a plurality of scan sub-chains coupled to the serial input;
a scan sub-chain controller coupled to the plurality of scan sub-chains for selecting only one of the scan sub-chains and for gating only two of a plurality of scan clock pulses to a scan clock input of only the selected scan sub-chain; and
a scan sub-chain input multiplexer for connecting a scan shift input of each of the scan sub-chains either to a scan shift output of another one of the scan sub-chains or to the serial input.

10. The scan chain partition of claim 9 further comprising a shift register, the shift register comprising:
a serial shift input coupled to the serial input; and
parallel outputs coupled respectively to a shift input of each of the scan sub-chains.

11. A scan chain partition comprising:
a serial input coupled to a scan input signal pin of a module under test;
a plurality of scan sub-chains coupled to the serial input;
a scan sub-chain controller coupled to the plurality of scan sub-chains for selecting only one of the scan sub-chains and for gating only two of a plurality of scan clock pulses to a scan clock input of only the selected scan sub-chain;
a shift register having a serial shift input coupled to the serial input and parallel outputs for coupling respectively to a shift input of each of the scan sub-chains; and
a scan sub-chain input multiplexer for connecting a scan shift input of each of the scan sub-chains either to a scan shift output of another one of the scan sub-chains or to one of the parallel outputs of the shift register.

12. A method comprising steps of:
(a) receiving a serial input signal from a scan input signal pin of a module under test;
(b) coupling the serial input signal to a scan shift input of each of a plurality of scan sub-chains; and
(c) generating a scan sub-chain control signal that selects only one of the scan sub-chains while only two scan clock pulses are gated to a scan clock input of the selected scan sub-chain.

13. The method of claim 12, step (c) further comprising selecting a different one of the scan sub-chains after gating each two scan clock pulses.

14. A method comprising steps of:
(a) receiving a serial input signal from a scan input signal pin of a module under test;
(b) coupling the serial input signal to a scan shift input of each of a plurality of scan sub-chains;
(c) generating a scan sub-chain control signal for selecting only one of the scan sub-chain; and
(d) gating only two of a plurality of scan clock pulses to a scan clock input of the selected scan sub-chain; and
(e) connecting a scan shift input of each of the scan sub-chains either to a scan shift output of another one of the scan sub-chains or to the serial input.

15. The method of claim 14 further comprising steps of:
shifting the serial input through a shift register in step (b); and
coupling parallel outputs of the shift register respectively to a shift input of each of the scan sub-chains.

16. A method comprising steps of:
(a) receiving a serial input signal from a scan input signal pin of a module under test;
(b) coupling the serial input signal to a scan shift input of each of a plurality of scan sub-chains;
(c) generating a scan sub-chain control signal for selecting only one of the scan sub-chains;
(d) gating only two of a plurality of scan clock pulses to a scan clock input of the selected scan sub-chain;
(e) shifting the serial input through a shift register in step (b) for coupling parallel outputs of the shift register respectively to a shift input of each of the scan sub-chains; and
(f) connecting a scan shift input of each of the scan sub-chains either to a scan shift output of a previous scan sub-chain or to one of the parallel outputs of the shift register.

* * * * *